(12) United States Patent  
Watanabe et al.

(10) Patent No.: US 9,093,140 B2  
(45) Date of Patent: Jul. 28, 2015

(54) SEMICONDUCTOR MEMORY DEVICE

(71) Applicant: KABUSHIKI KAISHA TOSHIBA, Minato-ku (JP)

(72) Inventors: Toshiharu Watanabe, Mie-ken (JP); Yoshiaki Asao, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/225,037

(22) Filed: Mar. 25, 2014

(65) Prior Publication Data

US 2014/0204653 A1  Jul. 24, 2014

Related U.S. Application Data

(63) Continuation of application No. 13/428,246, filed on Mar. 23, 2012, now Pat. No. 8,711,602.

(30) Foreign Application Priority Data

Mar. 23, 2011  (JP) ................. 2011-064925

(51) Int. Cl.
*G11C 11/00* (2006.01)
*G11C 13/00* (2006.01)
(Continued)

(52) U.S. Cl.
CPC ............ *G11C 13/0002* (2013.01); *G11C 11/16* (2013.01); *H01L 45/1206* (2013.01);
(Continued)

(58) Field of Classification Search
CPC .. G11C 13/0002; G11C 11/16; G11C 11/404; H01L 45/1206
USPC .................................. 365/148, 63
See application file for complete search history.

(56) References Cited

U.S. PATENT DOCUMENTS 6,031,262 A   2/2000 Sakao
(Continued)

FOREIGN PATENT DOCUMENTS

JP    06-275083       9/1994
JP    2006-294206    10/2006
(Continued)

OTHER PUBLICATIONS

Office Action issued Jun. 18, 2013, in Japanese Patent Application No. 2011-064925, filed Mar. 23, 2011 (English only).
(Continued)

*Primary Examiner* — Viet Q Nguyen
(74) *Attorney, Agent, or Firm* — Oblon, McClelland, Maier & Neustadt, L.L.P.

(57) ABSTRACT

A semiconductor memory device includes: a plurality of word lines extending in a first direction; first to third bit lines extending in a second direction that intersects with the first direction; a plurality of variable resistance elements each having a first terminal connected to either one of the first and third bit lines; a plurality of active areas extending in a direction oblique to the first direction while intersecting with the first to third bit lines; a plurality of select transistors provided on the active areas and each having a gate connected to a corresponding one of the word lines, and a current path whose one end is connected to a second terminal of a corresponding one of the variable resistance elements; and a plurality of contact plugs each connecting the other end of the current path of a corresponding one of the select transistors to the second bit line, wherein each of the active areas includes two select transistors sharing a diffusion region, the variable resistance elements includes a first variable resistance element group and a second variable resistance element group, the first variable resistance element group including variable resistance elements aligned in the second direction below the first bit line, and each disposed between adjacent two of the word lines, the second variable resistance element group including variable resistance elements aligned in the second direction below the third bit line, and each disposed between adjacent two of the word lines, and the contact plugs are aligned in the second direction below the second bit line, and are each disposed between adjacent two of the word lines.

13 Claims, 22 Drawing Sheets

(51) Int. Cl.
  *G11C 11/16* (2006.01)
  *H01L 45/00* (2006.01)
  *G11C 11/404* (2006.01)
  *H01L 27/02* (2006.01)

(52) U.S. Cl.
  CPC .......... *H01L45/1233* (2013.01); *G11C 11/404* (2013.01); *H01L 27/0207* (2013.01); *H01L 45/124* (2013.01)

(56) References Cited

U.S. PATENT DOCUMENTS

| | | | |
|---|---|---|---|
| 6,853,029 B2 | 2/2005 | Ichige et al. | |
| 6,888,745 B2* | 5/2005 | Ehiro et al. | 365/158 |
| 6,920,058 B2* | 7/2005 | Morikawa | 365/94 |
| 6,937,505 B2* | 8/2005 | Morikawa | 365/158 |
| 7,057,922 B2* | 6/2006 | Fukumoto | 365/158 |
| 7,123,498 B2 | 10/2006 | Miyatake et al. | |
| 7,470,923 B2 | 12/2008 | Takaura et al. | |
| 7,511,985 B2* | 3/2009 | Horii et al. | 365/148 |
| 7,529,114 B2* | 5/2009 | Asao | 365/63 |
| 7,660,148 B2* | 2/2010 | Yokoi | 365/148 |
| 7,697,317 B2* | 4/2010 | Shimaoka et al. | 365/148 |
| 7,719,885 B2 | 5/2010 | Hidaka | |
| 7,745,894 B2 | 6/2010 | Asao et al. | |
| 7,961,497 B2 | 6/2011 | Khoury et al. | |
| 8,111,540 B2 | 2/2012 | Asao et al. | |
| 8,179,707 B2 | 5/2012 | Song et al. | |
| 8,179,714 B2* | 5/2012 | Takagi et al. | 365/148 |
| 8,233,309 B2* | 7/2012 | Fasoli | 365/148 |
| 8,233,310 B2* | 7/2012 | Fujita et al. | 365/148 |
| 8,369,127 B2 | 2/2013 | Maejima | |
| 8,369,129 B2* | 2/2013 | Fujita et al. | 365/148 |
| 8,450,145 B2* | 5/2013 | Inoue | 438/104 |
| 8,508,978 B2* | 8/2013 | Ishihara et al. | 365/148 |
| 8,711,602 B2* | 4/2014 | Watanabe et al. | 365/148 |
| 8,711,632 B2* | 4/2014 | Katayama | 365/185.2 |
| 2008/0123393 A1* | 5/2008 | Kinoshita | 365/148 |
| 2012/0044742 A1* | 2/2012 | Narayanan | 365/148 |
| 2014/0334217 A1* | 11/2014 | Ueda et al. | 365/63 |

FOREIGN PATENT DOCUMENTS

| | | |
|---|---|---|
| JP | 2007-317948 | 12/2007 |
| JP | 2008-091703 | 4/2008 |
| JP | 2008-123641 | 5/2008 |
| JP | 2008-130995 | 6/2008 |
| JP | 2009-151835 | 7/2009 |
| JP | 2009-289343 | 12/2009 |

OTHER PUBLICATIONS

Office Action issued Sep. 3, 2013, in Japanese Patent Application No. 2011-064925, filed Mar. 23, 2011 (English only).

* cited by examiner (a)
Parallel State
(Low Resistance State)

(b)
Anti-Parallel State
(High Resistance State)

First Unit

Second Unit

|     | CASE1   | CASE2    |
|-----|---------|----------|
| WL1 | Low     | Low      |
| WL2 | Low     | Low      |
| WL3 | High    | High     |
| BL1 | A or C  | A or C   |
| BL2 | B       | B        |
| BL3 | B       | Floating |

A<B<C

|  | CASE1 | CASE2 |
|---|---|---|
| WL1 | Low | Low |
| WL2 | Low | Low |
| WL3 | High | High |
| BL1 | A or C | A or C |
| BL2 | B | B |
| BL3 | B or Floating | B or Floating |
| BL4 | A or C | B |
| BL5 | B | B |
| BL6 | B or Floating | B |

A<B<C

First Direction

Second Direction

First Direction

Second Direction

First Direction

Second Direction

First Direction

Second Direction

SEMICONDUCTOR MEMORY DEVICE

CROSS-REFERENCE TO RELATED APPLICATIONS

This application is a continuation of U.S. application Ser. No. 13/428,246, filed Mar. 23, 2012, and is based upon and claims the benefit of priority from the prior Japanese Patent Application No. 2011-064925, filed Mar. 23, 2011, the entire contents of each of which are incorporated herein by reference.

BACKGROUND OF THE INVENTION

1. Field of the Invention

The present invention relates to a resistance change memory.

2. Description of the Related Art

A magnetic random access memory (MRAM) is known as a resistance change memory which stores data by utilizing resistance switching of memory elements. Further, there have been developed MRAM, using so-called spin-transfer torque writing methods, which write data by directly applying a current to a magnetic tunnel junction (MTJ) element. The MRAM is expected as candidate memories for substitutes of DRAM, for example.

DRAM with a cell size of $6F^2$ has been produced. On the other hand, MRAM has a larger number of wiring than DRAM, and therefore generally has a cell size of $8F^2$. Considering that MRAM is used as a substitute of DRAM, it is desirable to produce MRAM with a cell size of $6F^2$.

BRIEF SUMMARY OF THE INVENTION

A semiconductor memory device according to an aspect of the present invention includes: a plurality of word lines extending in a first direction; first to third bit lines extending in a second direction that intersects with the first direction; a plurality of variable resistance elements each having a first terminal connected to either one of the first and third bit lines; a plurality of active areas extending in a direction oblique to the first direction while intersecting with the first to third bit lines; a plurality of select transistors provided on the active areas and each having a gate connected to a corresponding one of the word lines, and a current path whose one end is connected to a second terminal of a corresponding one of the variable resistance elements; and a plurality of contact plugs each connecting the other end of the current path of a corresponding one of the select transistors to the second bit line, wherein each of the active areas includes two select transistors sharing a diffusion region, the variable resistance elements includes a first variable resistance element group and a second variable resistance element group, the first variable resistance element group including variable resistance elements aligned in the second direction below the first bit line, and each disposed between adjacent two of the word lines, the second variable resistance element group including variable resistance elements aligned in the second direction below the third bit line, and each disposed between adjacent two of the word lines, and the contact plugs are aligned in the second direction below the second bit line, and are each disposed between adjacent two of the word lines.

A semiconductor memory device according to an aspect of the present invention includes: a plurality of word lines extending in a first direction; first to third bit lines extending in a second direction that intersects with the first direction; a plurality of variable resistance elements each having a first terminal connected to either one of the first and third bit lines; a plurality of active areas extending in a direction oblique to the first direction while intersecting with the first to third bit lines; a plurality of select transistors provided on the active areas and each having a gate connected to a corresponding one of the word lines, and a current path whose one end is connected to a second terminal of a corresponding one of the variable resistance elements; a plurality of contact plugs each connecting the other end of the current path of a corresponding one of the select transistors to the second bit line; and a control circuit, wherein when writing data to the variable resistance elements, the control circuit sets a selected one of the word lines at a high level, and to apply different voltages to the first and second bit lines in accordance with the write data.

Hereinafter, an embodiment will be described with reference to the accompanying drawings. However, it should be noted that the drawings are schematic or conceptual, and thus the dimension, ratio of each drawing do not necessarily reflect the actual dimension or ratio. In addition, when the same portions are illustrated in corresponding drawings, the portions may be illustrated with mutually different dimensional relationships or ratios. Particularly, some embodiments hereinafter illustrate a device and a method for embodying the technical idea of the present invention, and which is not limited by the shape, structure, and arrangement of the components. In the following description, the components having the same function and configuration are labeled with the same reference symbols, and a redundant description is given only when necessary.

[1. Configuration of Resistance Change Memory]

As a resistance change memory in the present embodiment, various types of memories may be used such as a magnetic random access memory (MRAM), a resistive random access memory (ReRAM), and a phase-change random access memory (PCRAM). In the present embodiment, an MRAM is described as an example of a resistance change memory. The MRAM includes, as memory elements, magnetic tunnel junction (MTJ) elements using a magnetoresistive effect, and stores information by using magnetic alignment of the MTJ elements.

Figure 1:
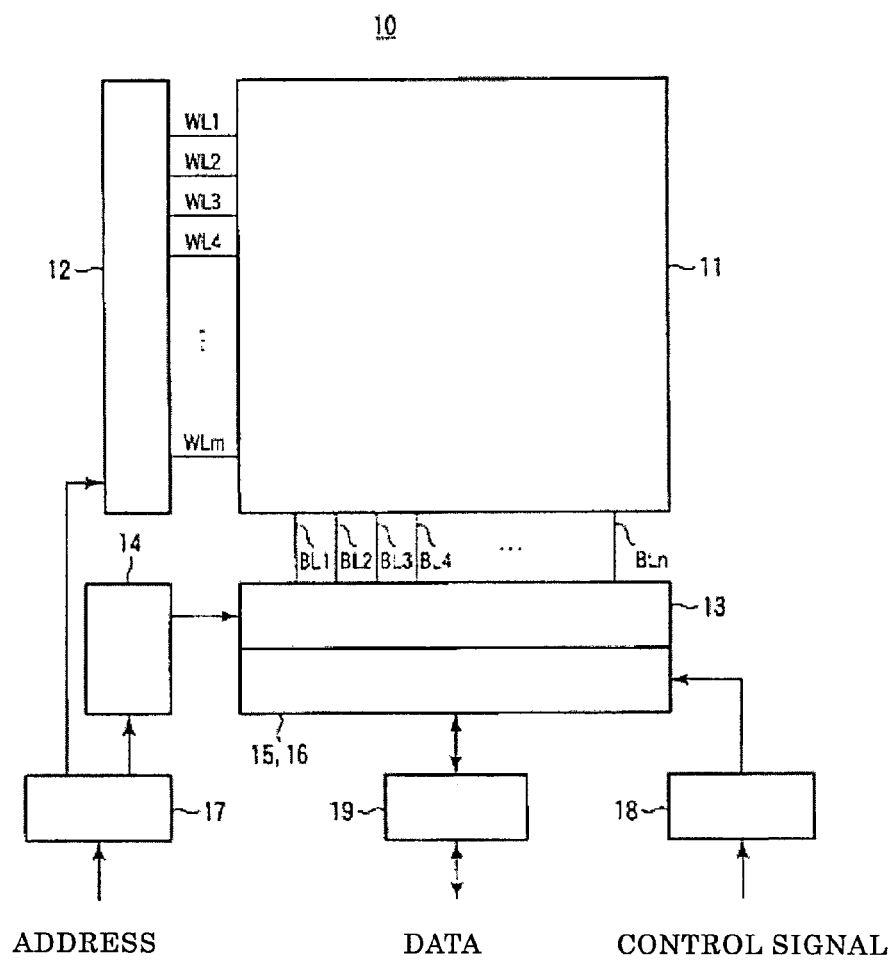
FIG. 1 is a block diagram illustrating the configuration of MRAM according to the present embodiment.

FIG. 1 is a block diagram illustrating the configuration of an MRAM 10 according to the present embodiment. A memory cell array 11 includes memory cells MC arranged in a matrix form. Each memory cell MC includes an MTJ element (variable resistance element) 20 and a select transistor 21. The memory cell array 11 is provided with m word lines WL1 to WLm extending in a first direction, and n bit lines BL1 to BLn extending in a second direction intersecting with the first direction. M is an integer of 2 or more, and n is an integer of 3 or more.

A row decoder 12 is connected to the word lines WL1 to WLm. The row decoder 12 selects a word line WL based on a row address.

A sense amplifier (read circuit) 15 and a write driver (write circuit) 16 are connected to the bit lines BL1 to BLn via a column selection circuit 13. The column selection circuit 13 includes, for example, N-channel metal oxide semiconductor field effect transistors (MOSFET) of a number equal to the number of bit lines BL1 to BLn, and selects a bit line BL necessary for an operation in accordance with a command from the column decoder 14. The column decoder 14 decodes a column address and sends the decoded signal to the column selection circuit 13.

A sense amplifier 15 detects data stored in a selected memory cell of a read target based on a read current flowing through the selected memory cell. The data read by the sense amplifier 15 is outputted to the outside via an input/output buffer (I/O buffer) 19.

A write driver 16 receives write data from the outside via the I/O buffer 19. The write driver 16 writes data into a selected memory cell of a write target, by applying a write current to the corresponding bit line BL. Here, the row decoder 12, the column selection circuit 13, the column decoder 14, the sense amplifier 15, the write driver 16, an address buffer 17, a control signal buffer 18, and the I/O buffer 19 are also referred to as a control circuit collectively. Instead, in some cases, a control circuit includes at least one of the row decoder 12, the column selection circuit 13, the column decoder 14, the sense amplifier 15, the write driver 16, the address buffer 17, the control signal buffer 18, and the I/O buffer 19.

The address buffer 17 receives an address from the outside. The address buffer 17 then sends a row address to the row decoder 12, and sends a column address to the column decoder 14. The control signal buffer 18 receives a control signal from the outside, and sends the control signal to the sense amplifier 15 and the write driver 16. The control signal contains a command such as a write command, a read command, or an erase command.

Figure 2:
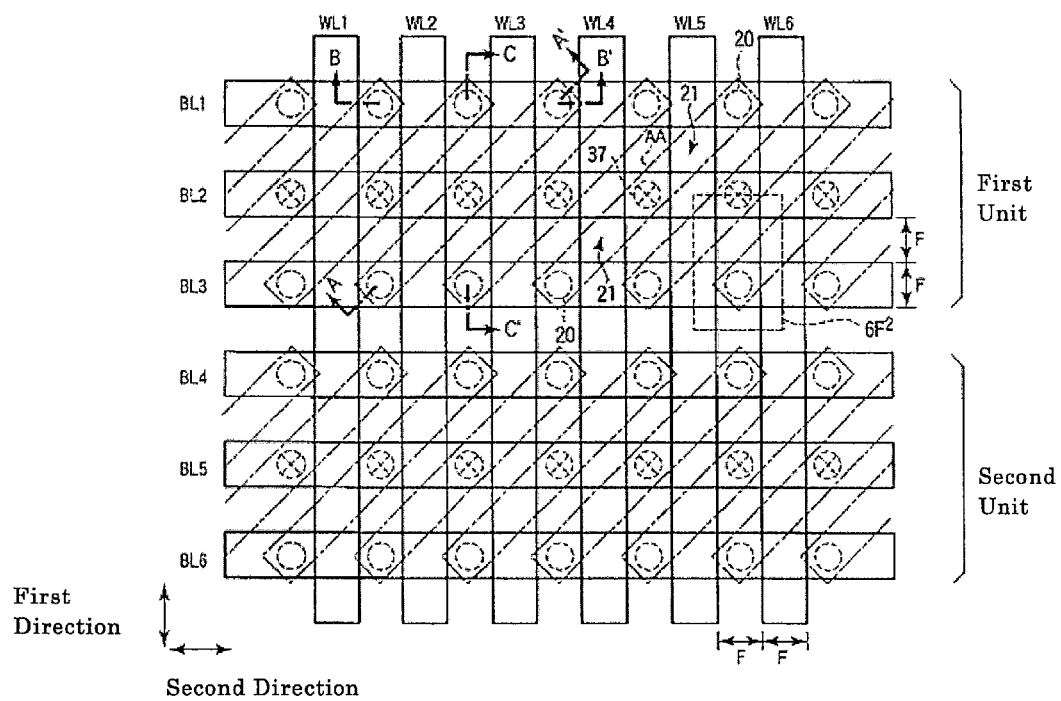
FIG. 2 is a plan view of a memory cell array.
Figure 3:
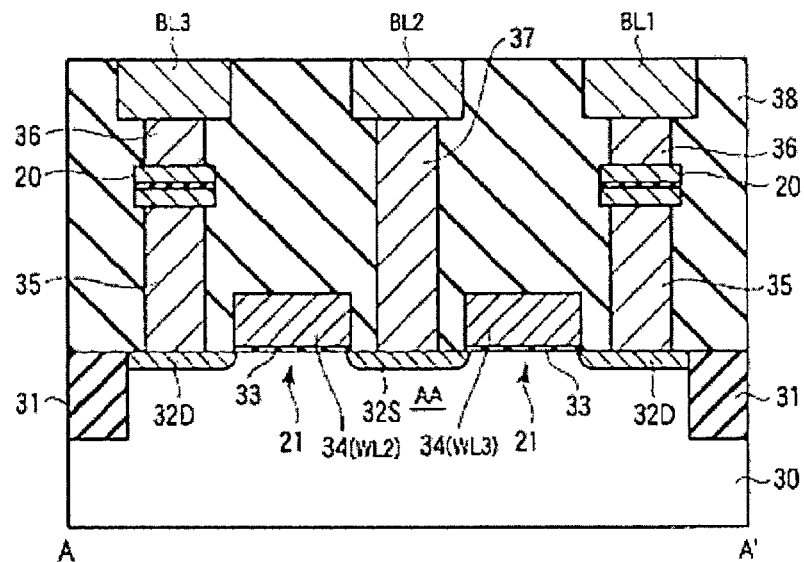
FIG. 3 is a cross-sectional view of the memory cell array taken along line A-A' illustrated in FIG. 2.
Figure 4:
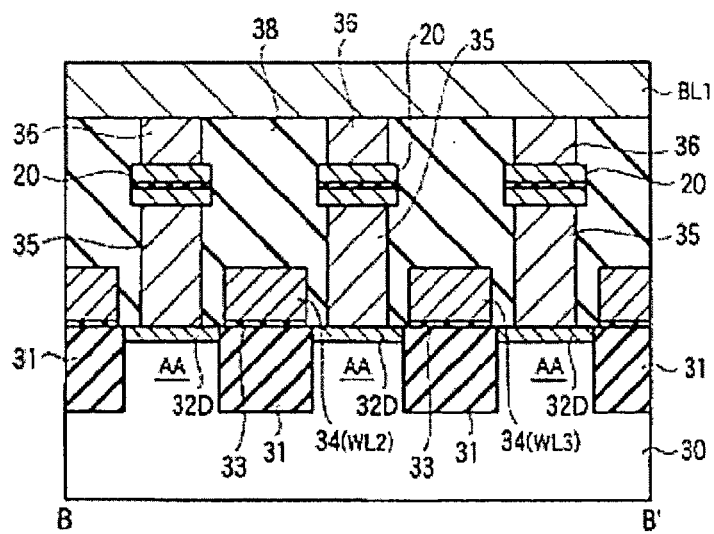
FIG. 4 is a cross-sectional view of the memory cell array taken along line B-B' illustrated in FIG. 2.
Figure 5:
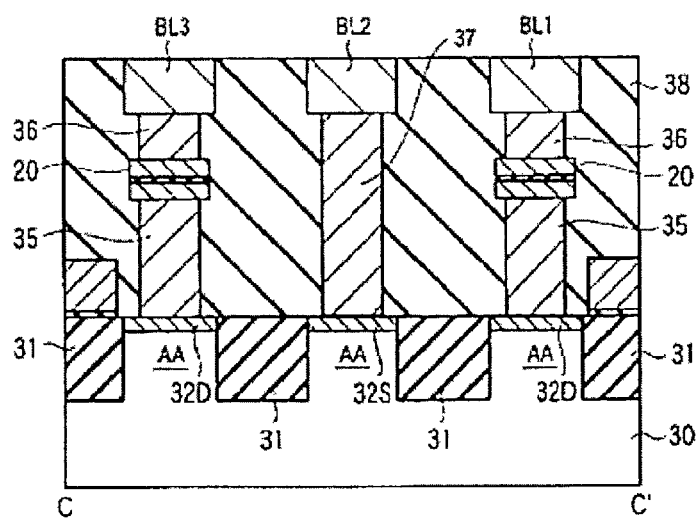
FIG. 5 is a cross-sectional view of the memory cell array taken along line C-C' illustrated in FIG. 2.

Next, a configuration of the memory cell array 11 is described. FIG. 2 is a plan view of the memory cell array 11. FIG. 3 is a cross-sectional view of the memory cell array 11 taken along line A-A' illustrated in FIG. 2. FIG. 4 is a cross-sectional view of the memory cell array 11 taken along line B-B' illustrated in FIG. 2. FIG. 5 is a cross-sectional view of the memory cell array 11 taken along line C-C' illustrated in FIG. 2. In FIG. 2, 6 word lines WL1 to WL6, 6 bit lines BL1 to BL6, and the memory cells connected to the 6 word lines and the 6 bit lines are extracted and illustrated.

An element isolation insulating layer 31 is provided in a p-type semiconductor substrate 30. An area where no element isolation insulating layer 31 is formed in the surface region of the p-type semiconductor substrate 30 is an element area (active area) AA. In other word, a p-type semiconductor substrate 30 is divided by element isolation insulating layer 31 to provide the element area in a p-type semiconductor substrate 30. In FIG. 2, a portion surrounded by an alternate long and short dash line indicates the element area AA. The element isolation insulating layer 31 is formed by, for example, shallow trench isolation (STI) processing.

Figure 20:
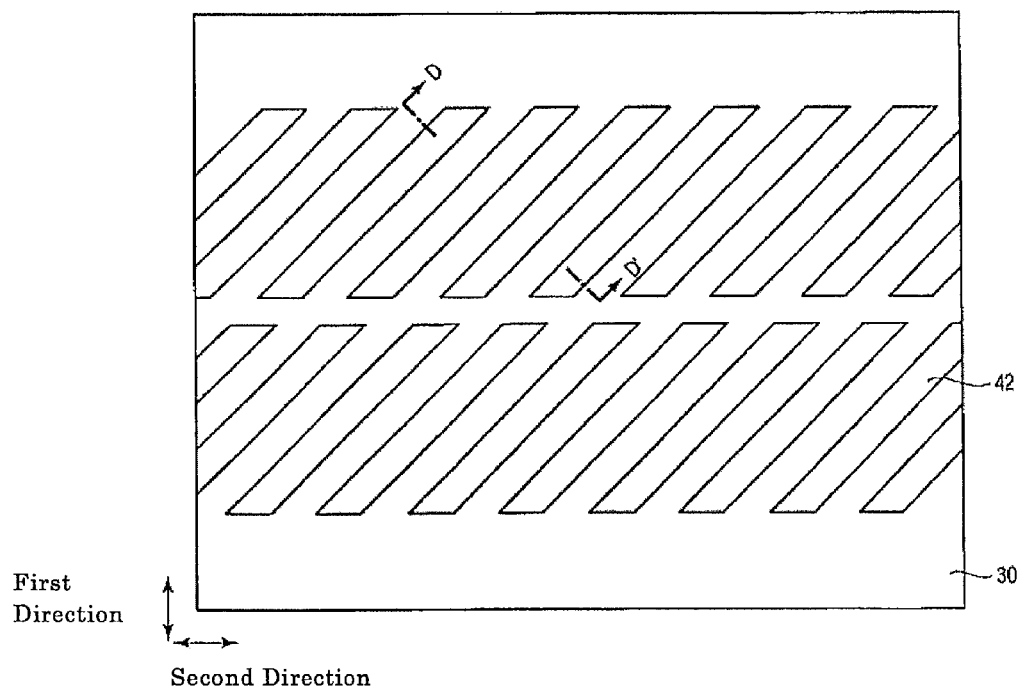
FIG. 20 is a plan view illustrating the manufacturing process of MRAM subsequent to FIG. 18.

Each of element areas AA has an island pattern, and the planar shape of the island pattern is, for example, approximately rectangular. Instead of being rectangular, the element area AA may be approximately rhombic as illustrated in FIG. 20. Each element area AA extends in an oblique direction while intersecting with three bit lines and two word lines. Plurality of element areas AA aligned in the second direction have a translational symmetry and are arranged at regular intervals.

Two select transistors 21 are provided on each element area AA. The select transistor 21 includes, for example, an n-channel MOSFET. Specifically, the element area AA is provided with a source region 32S and a drain region 32D. The source region 32S and the drain region 32D are each formed of an N+ type diffusion region which is formed by introducing a high-concentration N+ type impurity (such as phosphorus (P) or arsenic (As)) into the element area AA.

A gate electrode 34 is provided on a gate insulating film 33 formed on the element area AA (i.e., on the channel region) between the source region 32S and the drain region 32D. The gate electrode 34 corresponds to the word line WL. A silicon oxide, for example, is used as the gate insulating film 33. Polycrystalline silicon, for example, is used as the gate electrode 34.

An MTJ element 20 is provided on a contact plug 35 formed on the drain region 32D. The planar shape of the MTJ element 20 is not specifically limited. For example, the planar shape may be a circle, a quadrilateral, an ellipse, or the like. The bit line BL extending in the second direction is provided on a via plug 36 formed on the MTJ element 20. In other words, the contact plug 35, the MTJ element 20, and the via plug 36 are disposed on the element area AA.

A contact plug 37 is provided on the source region 32S. Another bit line BL, which is close to and has an equal level with the bit line connected to the MTJ element 20, is provided on the contact plug 37. In other words, the contact plug 37 is disposed on the element area AA.

Two select transistors 21 provided in one and the same element area AA share the source region 32S. The two select transistors 21 are connected to the common bit line BL via the source region 32S. A layer insulation layer 38 is filled between the p-type semiconductor substrate 30 and the bit line BL.

As illustrated in FIG. 4, the element isolation insulating layer 31 is formed in the semiconductor substrate 30. The word line WL extends in the first direction across the element area AA and the element isolation insulating layer 31.

Here, the characteristics of the layout of the MTJ element 20 and the contact plug 37 are described. Assuming that a group of memory cells connected to the three bit lines BL1 to BL3 is one unit, the units are repetitively arranged in the first direction to form the memory cell array 11. In the following description, the layout of a first unit connected to the bit lines BL1 to BL3 is described as an example. However, a second unit connected to the bit lines BL4 to BL6, and the subsequent units have the same configuration as the first unit. The element area AA can be separated from each other between the first unit and the second unit.

As illustrated in FIG. 2, a first MTJ element group of MTJ elements connected to the bit line BL1 and aligned in the second direction is disposed under (directly below) the bit line BL1, and one MTJ element is disposed between each adjacent two of the word lines WL1 to WL6. Similarly, a second MTJ element group of MTJ elements connected to the bit line BL3 and aligned in the second direction is disposed under (directly below) the bit line BL3, and one MTJ element is disposed between each adjacent two of the word lines WL1 to WL6.

A group of contact plugs 37 connected to bit line BL2 and aligned in the second direction is disposed below the bit line BL2, and one contact plug 37 is disposed between each adjacent two of the word lines WL1 to WL6.

When the memory cell array 11 having the layout as illustrated in FIG. 2 is assumed to be formed in minimum feather size F in terms of a width of a bit line, a space of bit lines, a width of a word line, and a space between word lines, the size (repeating unit) of the memory cell is $6F^2$. Furthermore, all the bit lines BL may be formed of a wiring layer at one and the same level. More specifically, the bit lines connected to the MTJ elements 20, and the bit lines connected to the contact plugs 37 on the source regions 32S can be formed by wiring layers at the same level. Consequently, the manufacturing process can be simplified. In this manner, in the present embodiment, all the bit lines BL can be formed by wiring layers at the same level, and the cell size (repeating unit) of $6F^2$ can be achieved.

When the bit lines and the word lines have the same pitch, and intersect with each other at right angles as illustrated in FIG. 2, the element area AA is inclined 45 degrees with respect to the second direction. However, an embodiment of the invention is not limited to the above case, and the bit lines and the word lines may have different pitches. For example, the bit lines may be formed with a regular pitch, and the word lines may be formed with another regular pitch different from that of the bit lines.

Figure 6:
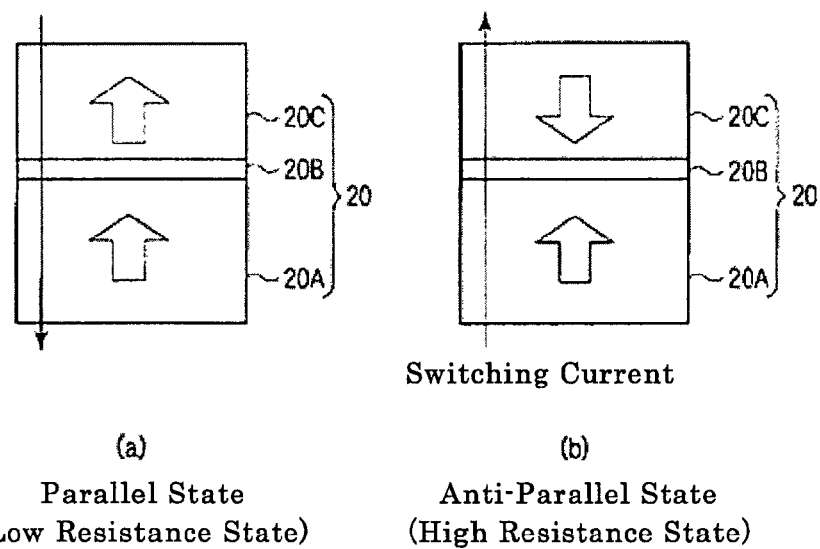
FIG. 6 is a schematic diagram illustrating the configuration of an MTJ element.

Next, a configuration of the MTJ element 20 is described. FIG. 6 is a schematic diagram illustrating the configuration of the MTJ element 20. The MTJ element 20 is formed by stacking a reference layer (also referred to as a fixed layer) 20A, a non-magnetic layer 20B, and a recording layer (also referred to as a memory layer or a free layer) 20C in this order. However, the stacking order may be reversed.

The recording layer 20C and the reference layer 20A are each made of a ferromagnetic material. The recording layer 20C and the reference layer 20A each have a magnetic anisotropy in a direction perpendicular to the film surface, and each have an easy direction of magnetization perpendicular to the film surface. In short, the MTJ element 20 is so-called a perpendicular magnetization MTJ element in which the magnetization directions of the recording layer 20C and the reference layer 20A are perpendicular to the film surface. The MTJ element 20 may be an in-plane magnetization MTJ element which has a magnetization direction is horizontal to the film surface.

The magnetization (or spin) direction of the recording layer 20C is variable (switchable). The magnetization direction of the reference layer 20A is invariable (fixed). The reference layer 20A is set to have sufficiently large perpendicular magnetic anisotropy energy with respect to the recording layer 20C. The settings of the magnetic anisotropy of a layer can be made by adjusting the material components and the film thickness thereof. In this manner, the magnetization switching current of the recording layer 20C is set small and the magnetization switching current of the reference layer 20A is set greater than that of the recording layer 20C. Consequently, the MTJ element 20 can be produced, in which upon receipt of a predetermined write current, the recording layer 20C switches its magnetization direction but the reference layer 20A keeps its magnetization direction unchanged.

A non-magnetic metal, a nonmagnetic semiconductor, an insulating material, or the like may be used as the non-magnetic layer 20B. The non-magnetic layer 20B made of an insulating material is referred to as a tunnel barrier layer, and the non-magnetic layer 20B made of a metal is referred to as a spacer layer.

The present embodiment employs the spin-transfer torque writing method which directly supplies a write current to the MTJ element 20 so that a magnetized state of the MTJ element 20 is controlled by the write current. The MTJ element 20 can have either one of two states of a high resistance state and a low resistance state according to whether or not the magnetization directions of the recording layer 20C and the reference layer 20A is a parallel or anti-parallel relationship.

As illustrated in FIG. 6A, when a write current flows into the MTJ element 20 from the recording layer 20C to the reference layer 20A, the magnetization directions of the recording layer 20C and the reference layer 20A have a parallel relationship. In the parallel state, the MTJ element 20 has the minimum resistance, that is, the MTJ element 20 is set in a low resistance state. The low resistance state of the MTJ element 20 is defined as data "0", for example.

On the other hand, as illustrated in FIG. 6B, when a write current flows into the MTJ element 20 from the reference layer 20A to the recording layer 20, the magnetization directions of the recording layer 20C and the reference layer 20A has an anti-parallel relationship. In the anti-parallel state, the MTJ element 20 has the maximum resistance, that is, the MTJ element 20 is set in a high resistance state. The high resistance state of the MTJ element 20 is defined as data "1", for example. Accordingly, the MTJ element 20 can be used as a memory element which can store 1 bit data (binary data).

Figure 7:
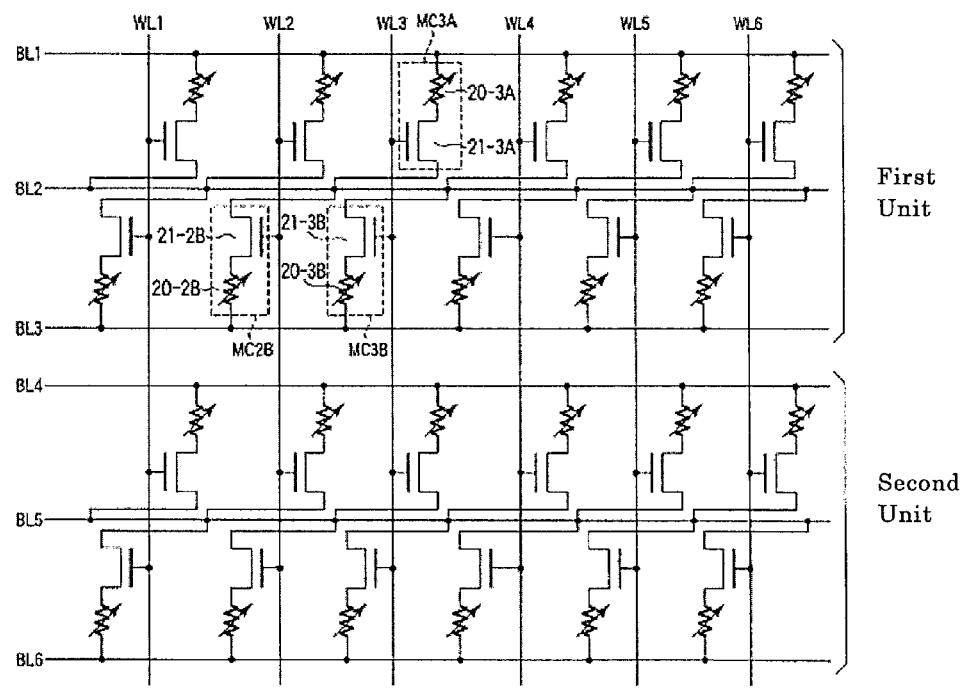
FIG. 7 is a circuit diagram of the memory cell array.

Next, the circuit configuration of the memory cell array 11 is described. FIG. 7 is a circuit diagram of the memory cell array 11. FIG. 7 illustrates a circuit diagram for the layout of FIG. 2.

Each memory cell MC includes the MTJ element 20 and the select transistor 21. A memory cell MC3A is electrically connected between the bit lines BL1 and BL2. A first terminal of a MTJ element 20-3A contained in the memory cell MC3A is electrically connected to the bit line BL1. A second terminal of the MTJ element 20-3A is electrically connected to one end of a current path of a select transistor 21-3A also contained in the memory cell MC3A. The other end of the current path of the select transistor 21-3A is electrically connected to the bit line BL2 via a node 37. The node 37 of FIG. 7 corresponds to the contact plug 37 of FIG. 2. The gate of the select transistor 21-3A is electrically connected to the word line WL3. The number "3" in the memory cell MC3A corresponds to the number "3" of the word line WL3.

A memory cell MC2B is electrically connected between the bit lines BL3 and BL2. A first terminal of a MTJ element 20-2B contained in the memory cell MC2B is electrically connected to the bit line BL3. A second terminal of the MTJ element 20-2B is electrically connected to one end of a current path of a select transistor 21-2B also contained in the memory cell MC2B. The other end of the current path of the select transistor 21-2B is electrically connected to the bit line BL2 via the node 37. A gate of the select transistor 21-2B is electrically connected to the word line WL2. The number "2" in the memory cell MC2B corresponds to the number "2" of the word line WL2. The select transistors 21-3A and 21-2B illustrated in FIG. 7 are formed in the same element area AA.

A memory cell MC3B is electrically connected between the bit lines BL2 and BL3. A first terminal of a MTJ element 20-3B contained in the memory cell MC3B is electrically connected to the bit line BL3. A second terminal of the MTJ element 20-3B is electrically connected to one end of a current path of a select transistor 21-3B also contained in the memory cell MC3B. The other end of the current path of the select transistor 21-3B is electrically connected to the bit line BL2 via another node 37. The node 37 of FIG. 7 corresponds to the contact plug 37 of FIG. 2. The gate of the select transistor 21-3B is electrically connected to the word line WL3. The number "3" in the memory cell MC3B corresponds to the number "3" of the word lines WL3. The gates of the select transistors 21-3A and 21-3B illustrated in FIG. 7 use the word line WL3 in common.

Hereinafter, memory cells MC1A, MC1B, MC2A, MC4A, and MC6B are connected in a manner similar to the memory cells MC3A, MC3B, and MC2B. The number of the memory cells MC contained in one unit is twice the number of the word lines WL.

[2. Operation]

Next, an operation of MRAM 10 is described. FIG. 8 is a diagram illustrating the writing operation of the MRAM 10. Here, consider a case of writing data to the MTJ element 20-3A indicated by a dashed circle line of FIG. 8, for example.

First, a row decoder 12 selects the word line WL3, and sets the word line WL3 to a high level. Accordingly, the select transistor 21-3A connected to the MTJ element 20-3A turns on. Subsequently, a write driver 16 sets the bit lines BL1 and BL2 voltage level to cause a write current to flow through the MTJ element 20-3A in accordance with the write data. A current as in FIG. 6A or FIG. 6B flows, for example, with application of different voltages to the bit line BL1 and the bit line BL2. Accordingly, the MTJ element 20-3A is set to have a magnetic alignment corresponding to the data.

Since the word line WL3 is set at a high-level and a voltage is applied to the bit line BL2, the select transistor 21-3B connected to the word line WL3 turns on, and the MTJ element 20-3B connected to the select transistor 21-3B is in a half-selected state. Consequently, a current may flow through the MTJ element 20-3B when the voltage of the bit line BL3 is at a certain level, and thus the magnetic alignment of the MTJ element 20-3B may be switched (an erroneous write occurs).

Figures 8A, 8B:
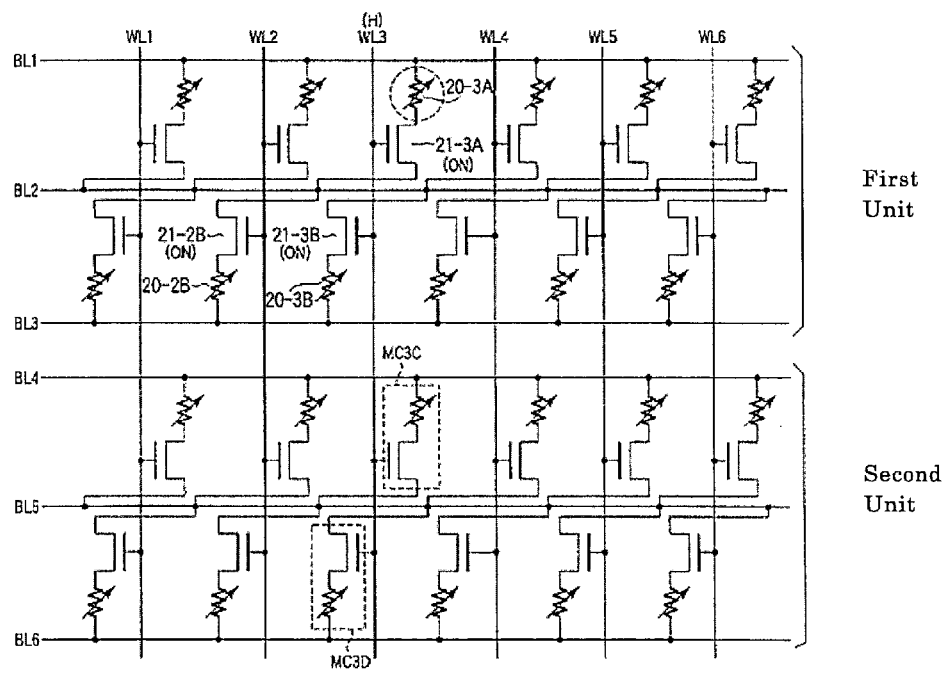
FIG. 8A is a diagram illustrating the writing operation of MRAM.
FIG. 8B is a table in the writing operation of MRAM.

In the present embodiment, as a measure to this, the write driver 16 applies the same voltage as that of the bit line BL2 to the bit line BL3 connected to the MTJ element 20-3B in the half-selected state (Case1 in FIG. 8B). Accordingly, a current can be prevented from flowing through the MTJ element 20-3B in the half-selected state.

In addition to the select transistor 21-3A connected to the selected memory cell MC3A, plurality of select transistors 21 are connected to the bit line BL2. For this reason, for example, 0V is applied to WLs other than the word line WL3 so that the select transistors are turned off. Consequently, the select transistors connected to the word lines other than the word line WL3 are turned off. In other words, current dose not flow through the MTJ elements 20 of the memory cells MC connected to the word lines WL1, WL2, and WL4 to WL6.

Figures 8C, 8D:
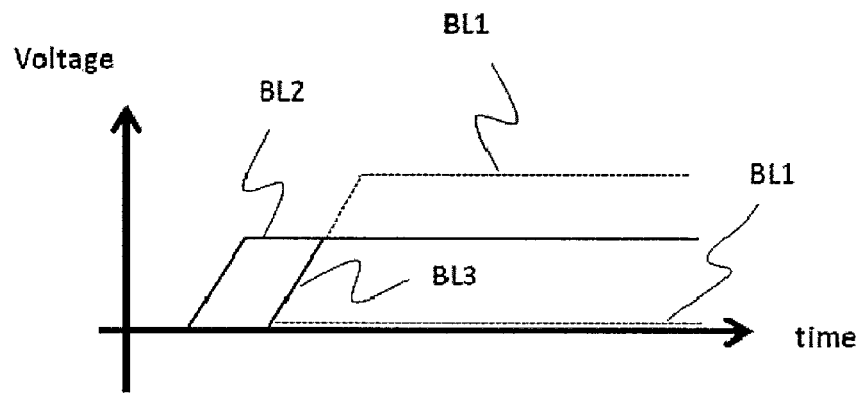
FIG. 8C is a voltage diagram illustrating in the writing operation of MRAM.
FIG. 8D is a table in the writing operation of MRAM.

Since the plurality of select transistors 21 are connected to the bit line BL2, a junction capacity caused by diffusion regions (e. q. source region or drain region) of the transistors is added to the bit line BL2. Accordingly, a capacity of the bit line BL2 to which the select transistors 21 are connected is larger than that of the bit lines BL1 and BL3 to which the MTJ elements 20 are connected. Thus, the write driver 16 delays a timing of applying a voltage to the bit lines BL1 and BL3 from a timing of applying a voltage to the bit line BL2(FIG. 8C). Accordingly, a potential difference between the bit lines BL2 and BL3 is prevented from being generated, and eventually, a current can be prevented from flowing through the MTJ element 20-3B in the half-selected state.

In writing data to the MTJ element 20-3A, the write driver 16 may set the bit line BL3 to be in a floating state (Case2 in FIG. 8B). Accordingly, the voltage of the bit line BL3 becomes approximately the same as the voltage of the bit line BL2 by coupling, and thus a potential difference between the bit lines BL2 and BL3 is prevented from being generated.

At the same time of writing data to the memory cell MC3A, data can be written to either one of the memory cells MC3C and MC3D connected to the word line WL3 in the memory cells MC in the second unit, by the potential relationship between the bit lines BL4, BL5, and BL6 to the same relationship between the bit lines BL1 and BL2. A current as in FIG. 6A or FIG. 6B flows, for example, when the write driver 16 applies voltages to the bit lines BL1, BL2, and BL3, and simultaneously applies different voltages to the bit line BL1 and the bit line BL2. Furthermore, the write driver 16 can apply the same voltages to the bit line BL5 and the bit line BL6 (Case1 in FIG. 8D).

In order to unselect the second unit, the second unit may be set to have a potential relationship similar to that of the MTJ element 20-3B in a half-selected state. For example, the write driver 16 can make the second unit unselected by applying voltages to the bit lines BL1 BL2 and BL3, and simultaneously applying the same voltages to the bit lines BL4, BL5, and BL6 (Case2 in FIG. 8D).

[3. Manufacturing Method]

Next, a manufacturing method of a MRAM 10 is described.

Figure 9:
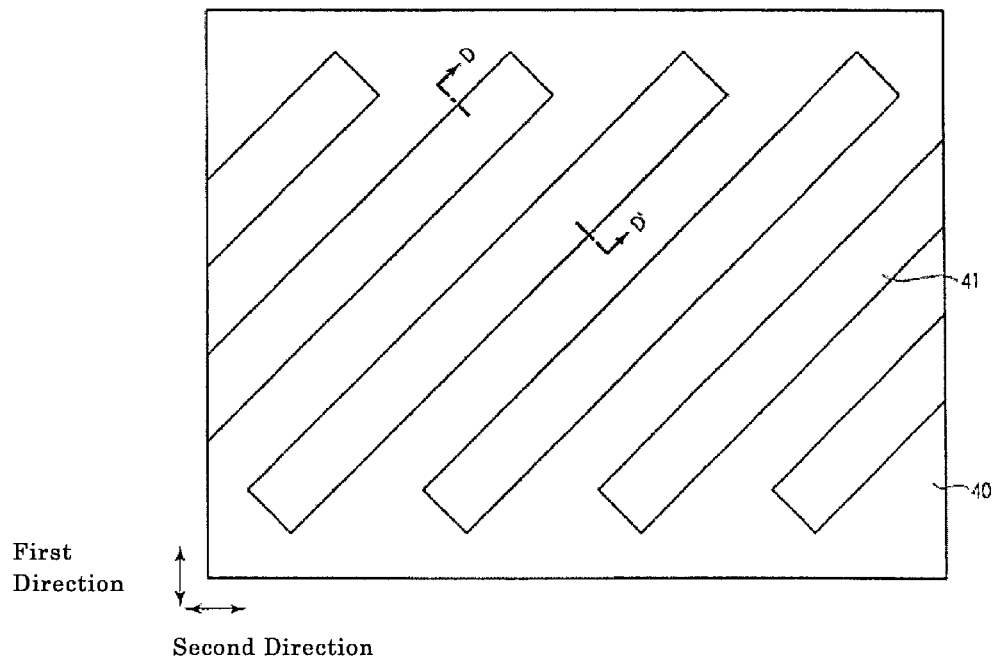
FIG. 9 is a plan view illustrating a manufacturing process of MRAM.
Figure 10:
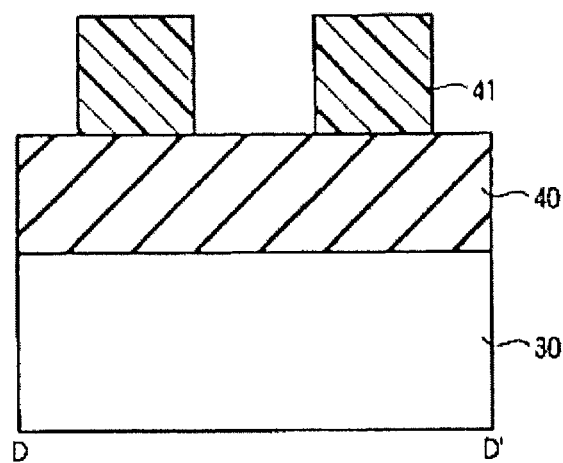
FIG. 10 is a cross-sectional view taken along line D-D' illustrated in FIG. 9.

FIG. 9 is a plan view illustrating a manufacturing process of the MRAM 10, and FIG. 10 is a cross-sectional view taken along line D-D' in FIG. 9. An insulating layer 40 as a hard mask layer is deposited on the semiconductor substrate 30 by using, for example, the chemical vapor deposition (CVD) method. For example, a silicon oxide is used as the insulating layer 40.

Plurality of resist layers 41 having a line and space pattern are formed on the insulating layer 40 by using the lithography method. The extending direction of the resist layers 41 is the same as the extending direction of the element areas AA, i.e., the resist layers 41 extend inclined with respect to the second direction. In the present embodiment, for example, the resist layers 41 extend at an angle of 45 degrees from the second direction.

Figure 11:
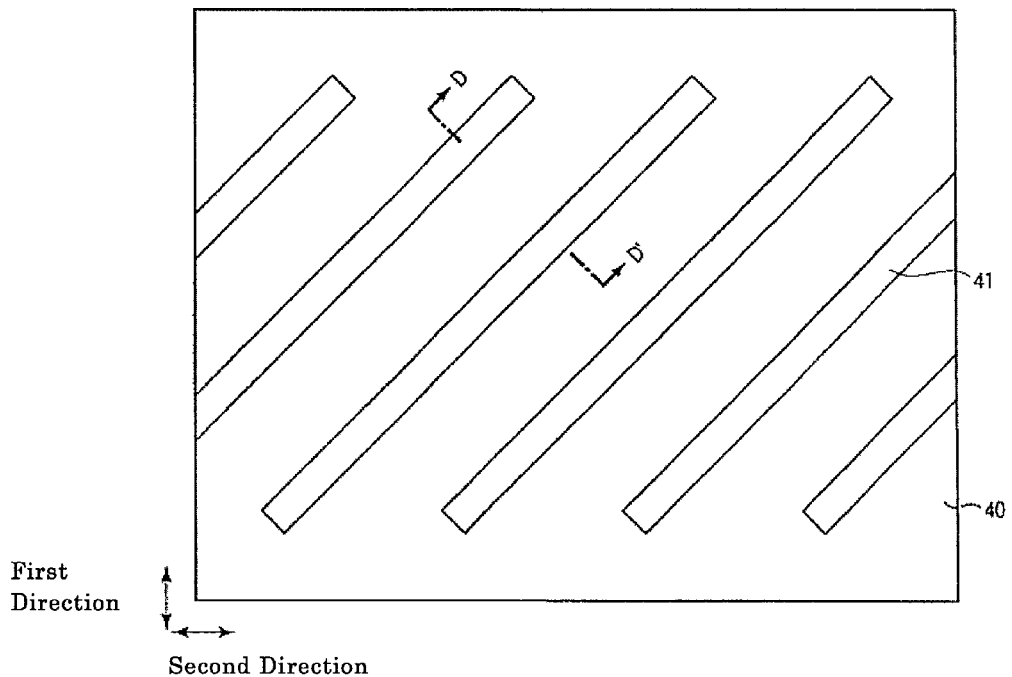
FIG. 11 is a plan view illustrating the manufacturing process of MRAM subsequent to FIG. 9.
Figure 12:
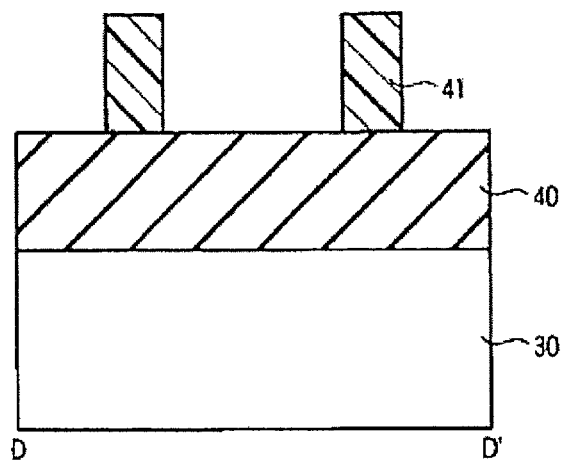
FIG. 12 is a cross-sectional view taken along line D-D' illustrated in FIG. 11.

As illustrated in FIGS. 11 and 12, the resist layers 41 are processed through so-called a slimming process in which the resist layers 41 are reduced in width, for example, by using the wet etching method. The slimming process reduces the width of the resist layers 41 to approximately half of the width before the slimming process.

Figure 13:
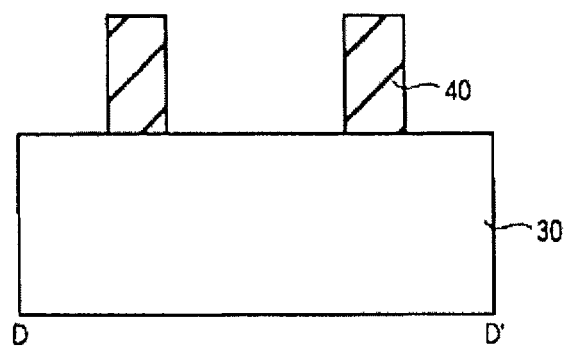
FIG. 13 is a cross-sectional view illustrating the manufacturing process of MRAM subsequent to FIG. 12.

As illustrated in FIG. 13, the insulating layer 40 is patterned, for example, by the reactive ion etching (RIE) method using the resist layers 41 as a mask. Accordingly, plurality of hard mask layers 40 having a line and space pattern are formed on the semiconductor substrate 30. Subsequently, the resist layers 41 are removed.

Figure 14:
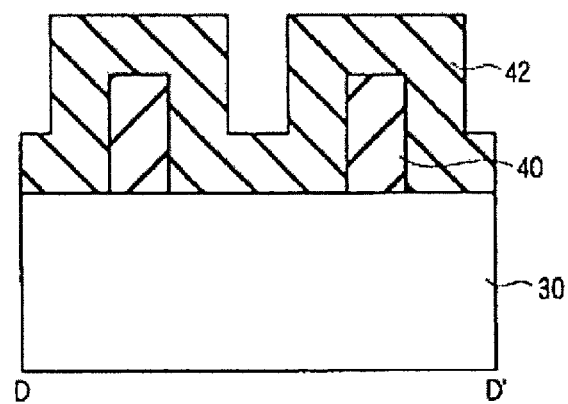
FIG. 14 is a cross-sectional view illustrating the manufacturing process of MRAM subsequent to FIG. 13.

As illustrated in FIG. 14, an insulating layer 42 is deposited over the entire device, for example, by using the CVD method. The insulating layer 42 is formed by using a material having an etch selectivity to the material of the hard mask layers 40. For example, silicon nitride is used.

Figure 15:
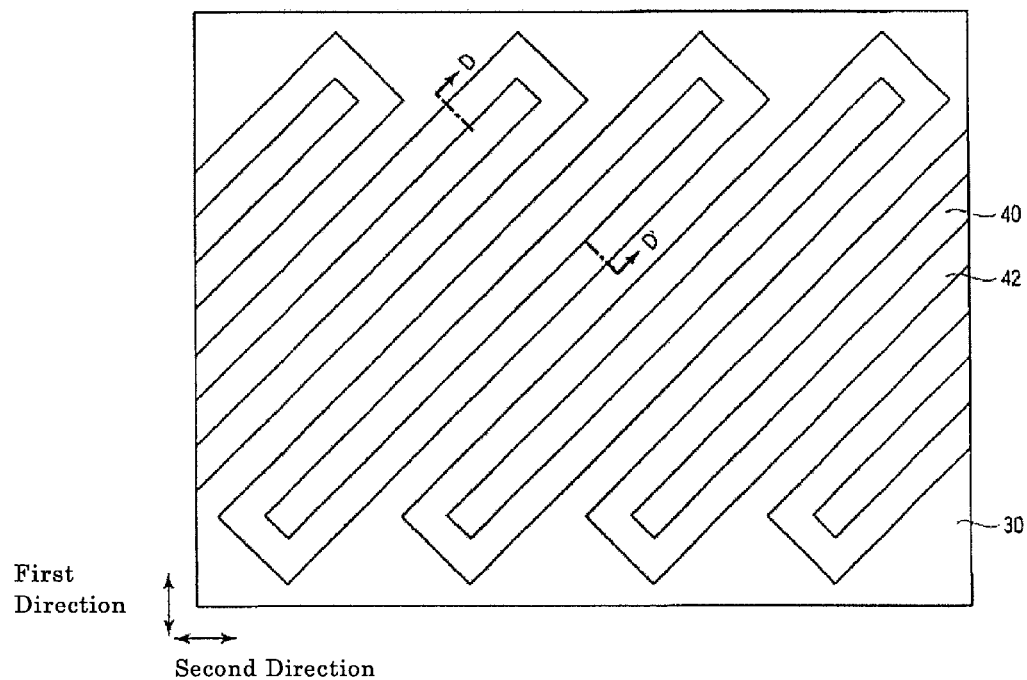
FIG. 15 is a plan view illustrating the manufacturing process of MRAM subsequent to FIG. 14.
Figure 16:
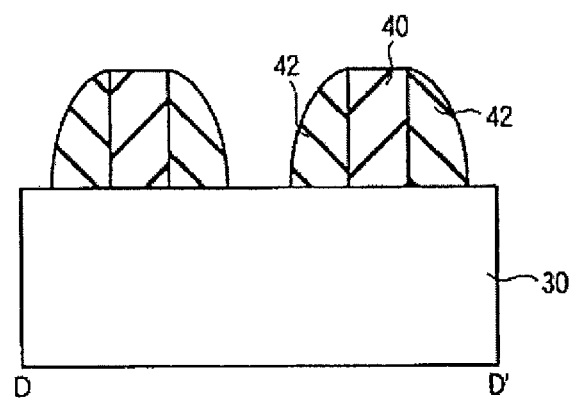
FIG. 16 is a cross-sectional view taken along line D-D' illustrated in FIG. 15.
Figure 17:
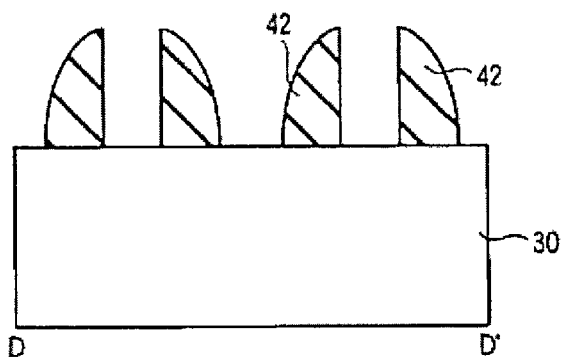
FIG. 17 is a cross-sectional view illustrating the manufacturing process of MRAM subsequent to FIG. 16.

Thereafter, as illustrated in FIGS. 15 and 16, the insulating layer 42 is selectively etched, for example, by using the RIE method, and thereby plurality of side walls 42 are formed on the side surfaces of the hard mask layers 40. The side wall 42 is formed in a loop around each of the hard mask layers 40. As illustrated in FIG. 17, the hard mask layers 40 are removed, for example, by using the wet etching method. Then, only the multiple side walls 42 remain on the semiconductor substrate 30.

Figure 18:
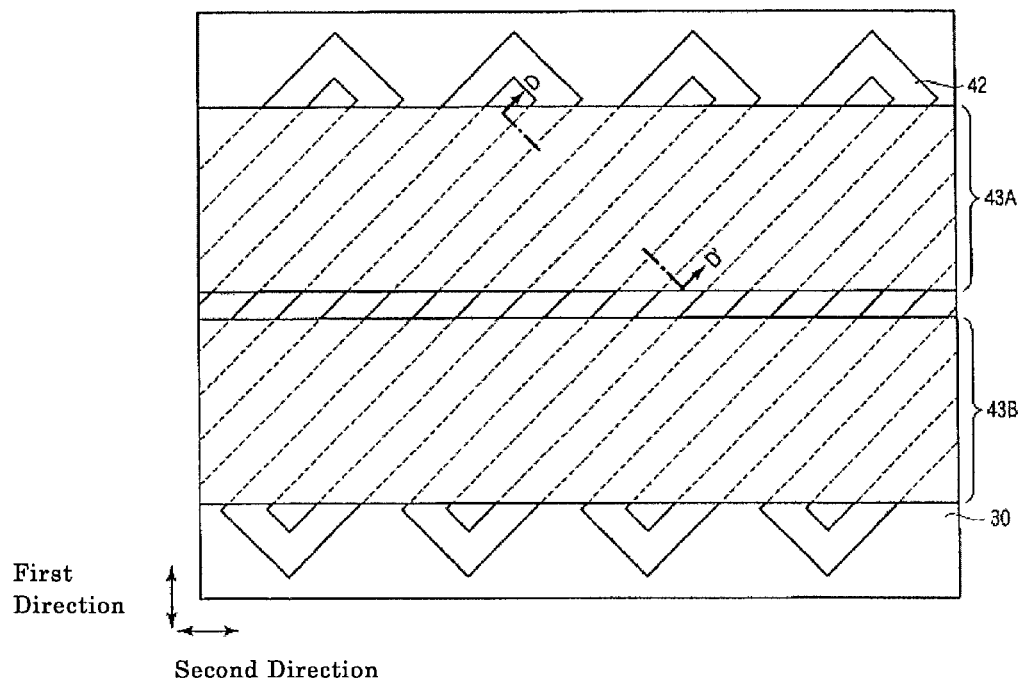
FIG. 18 is a plan view illustrating the manufacturing process of MRAM subsequent to FIG. 17.
Figure 19:
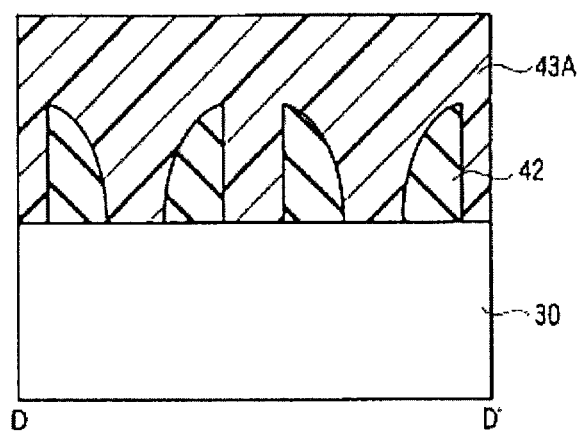
FIG. 19 is a cross-sectional view taken along line D-D' illustrated in FIG. 18.

As illustrated in FIGS. 18 and 19, resist layers 43A and 43B covering an element area AA formation scheduled region are formed using the lithography method. In other words, the loop-shaped side walls 42 are exposed only at their both ends and their center portion in an oblique direction.

Figure 21:
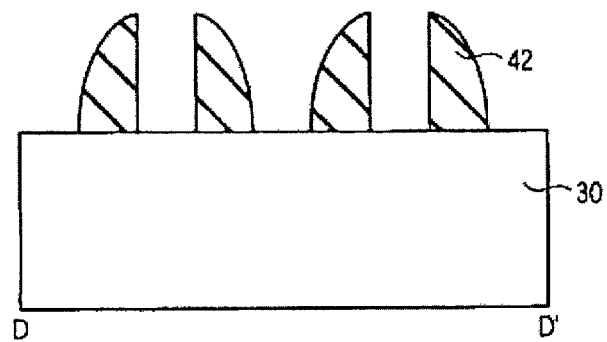
FIG. 21 is a cross-sectional view taken along line D-D' illustrated in FIG. 20.

As illustrated in FIGS. 20 and 21, the side walls 42 are etched by the RIE method using the resist layers 43A and 43B as a mask. Subsequently, the resist layers 43A and 43B are removed. Accordingly, the side walls (insulating layers) 42 in the same shape as the element areas AA remain on the semiconductor substrate 30.

Figure 22:
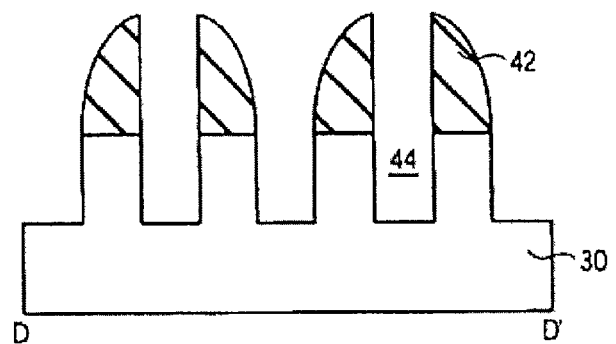
FIG. 22 is a cross-sectional view illustrating the manufacturing process of MRAM subsequent to FIG. 21.

As illustrated in FIG. 22, the semiconductor substrate 30 is selectively etched by the RIE method using the insulating layers 42 as a mask and thereby grooves 44 are formed in the semiconductor substrate 30.

Figure 23:
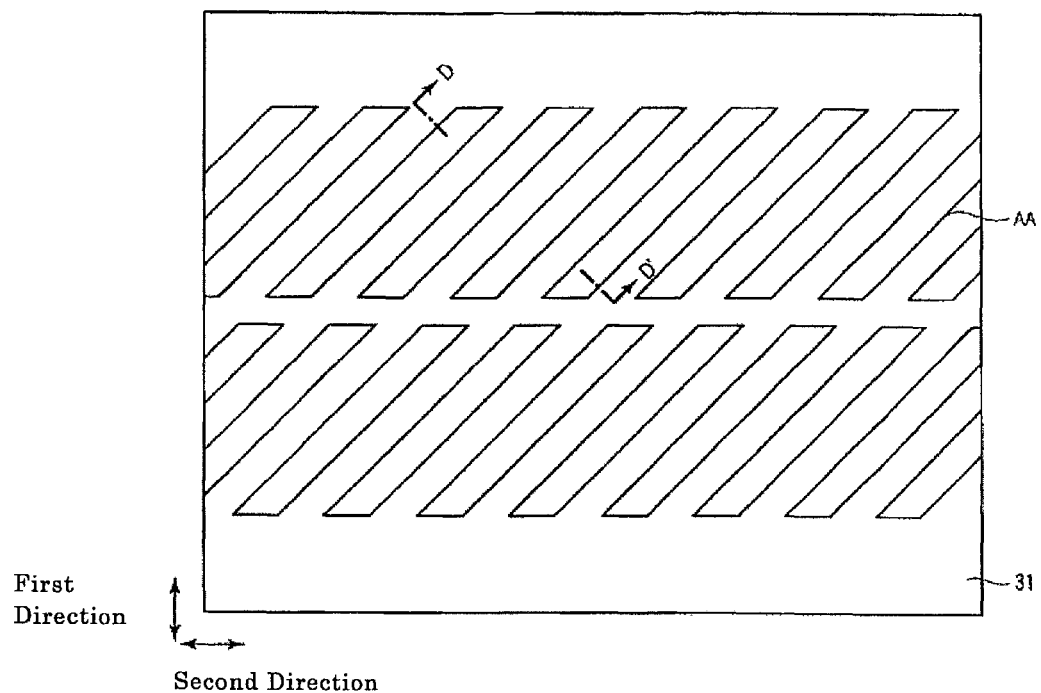
FIG. 23 is a plan view illustrating the manufacturing process of MRAM subsequent to FIG. 22.
Figure 24:
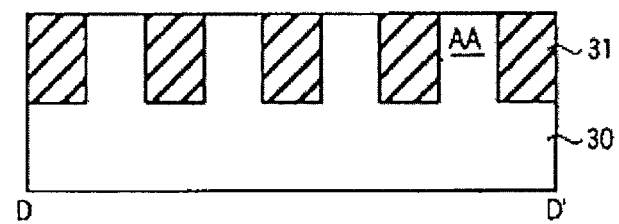
FIG. 24 is a cross-sectional view taken along line D-D' illustrated in FIG. 23.

As illustrated in FIGS. 23 and 24, element isolation insulating layers 31 are deposited in the grooves 44 of the semiconductor substrate 30 using the CVD method. The insulating layers 42 are removed, for example, by using the chemical mechanical polishing (CMP) method, and the upper surfaces of the element isolation insulating layers 31 are flattened. Accordingly, multiple element areas AA isolated from each other by the element isolation insulating layers 31 are formed on the surface area of the semiconductor substrate 30.

A select transistor 21, an MTJ element 20, and various wiring layers are formed using a general manufacturing method. In this manner, the MRAM 10 of the present embodiment is manufactured.

[4. Modification]

Figure 25:
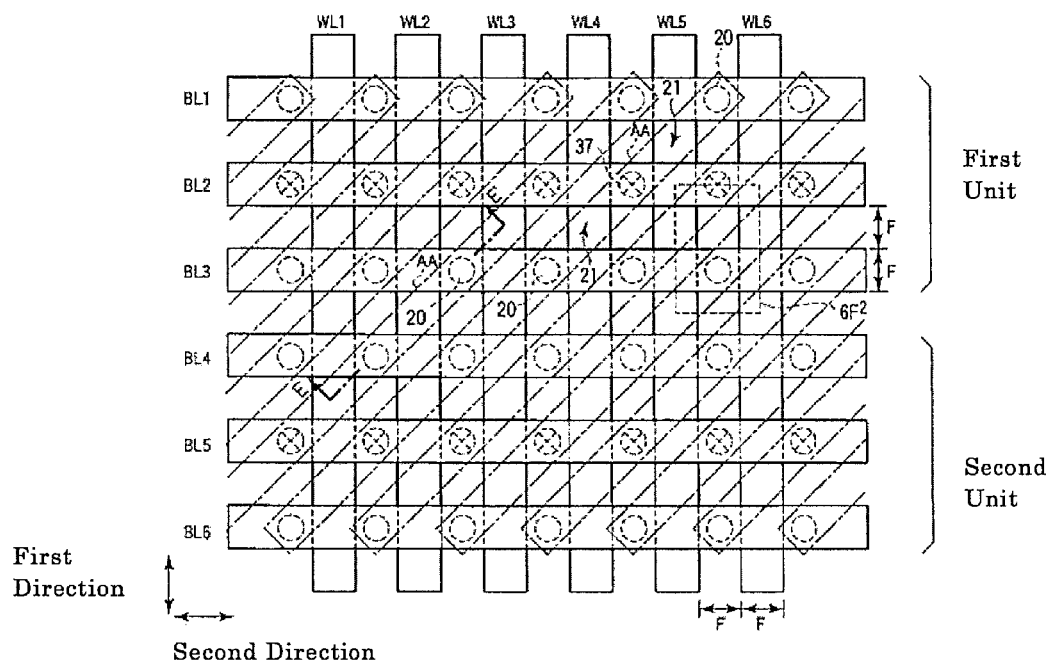
FIG. 25 is a plan view of a memory cell array according to a modification.
Figure 26:
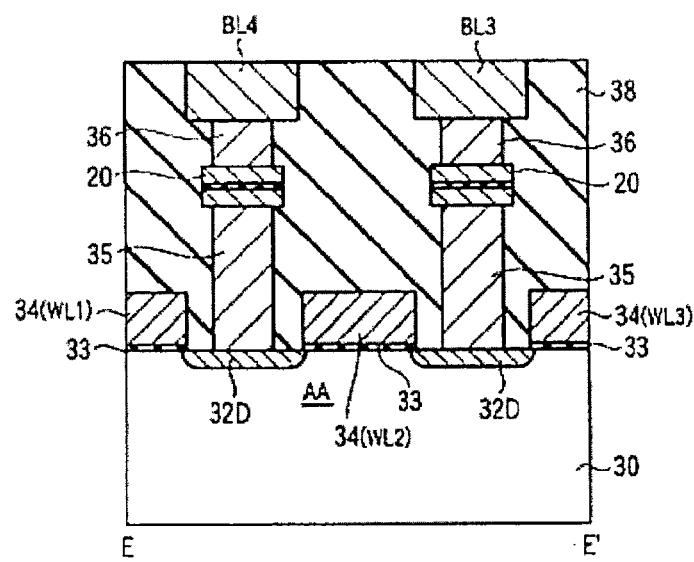
FIG. 26 is a cross-sectional view of the memory cell array taken along line E-E' illustrated in FIG. 25.

Next, the modification of the present embodiment is described. FIG. 25 is a plan view of a memory cell array 11 according to a modification of the present embodiment. FIG. 26 is a cross-sectional view of the memory cell array 11 taken along line E-E' in FIG. 25.

When a first unit containing the bit lines BL1 to BL3 and a second unit containing the bit lines BL4 to BL6 are arranged as illustrated in FIG. 25, an element area AA of the first unit and an element area AA of the second unit may be connected to each other as illustrated in FIG. 26. The configuration other than the configuration of the element areas AA is the same as in FIG. 2.

For example, in a write operation in which the word line WL3 is selected and a write current flows into the MTJ elements 20 connected to the bit line BL3, the word line WL2 immediately to the left of the word line WL3 is set to a low level. Accordingly, the select transistors 21 connected to the word line WL2 are turned off. Therefore, an unnecessary current does not flow into the second unit, and thus no erroneous write occurs in the unselected MTJ elements other than the selected MTJ element.

According to the modification, the manufacturing process of the element areas AA illustrated in FIGS. 18 and 19 can be simplified, and consequently the manufacturing cost of the MRAM 10 can be reduced.

[5. Effects]

In the present embodiment, as described in detail above, multiple word lines WL extending in the first direction are provided on the semiconductor substrate 30, and three bit lines BL1 to BL3 extending in the second direction are provided above the semiconductor substrate 30. Multiple MTJ elements are provided to be aligned in the second direction below the bit line BL1 so that one MTJ element can be disposed between each adjacent two of the multiple word lines. Plurality of MTJ elements are also provided below the bit line BL3 in the same manner as the bit line BL1. In addition, multiple contact plugs 37 connected to the select transistors 21 are disposed below the bit line BL2 so that one contact plug 37 can be disposed between each adjacent two of the multiple word lines. Furthermore, the element areas AA in which the select transistors 21 are formed extend in a direction oblique to the first direction, and two select transistors 21 sharing a single diffusion region are formed in one element area AA.

Thus, according to the present embodiment, the MRAM 10 having a cell size (repeating unit) of $6F^2$ can be produced, and therefore the miniaturization of the MRAM 10 can be achieved.

In addition, all the bit lines BL for supplying a current to the MTJ elements 20 can be formed by wiring layers at the same level. The MTJ elements 20 and the contact plugs 37 are disposed at regular intervals. Accordingly, the manufacturing process can be simplified and reduction in the yield can be prevented.

Use of the layout of the present application enables formation of the bit lines and the contact plugs having sufficient widths, and thereby can keep a wiring resistance and a contact resistance low. In addition, sufficient intervals can be secured between the bit lines and also between the bit lines and the contact plugs. Accordingly, the parasitic capacitance can be reduced. Consequently, the operational performance of the MRAM 10 can be improved.

Although some embodiments of the present invention have been described, those embodiments have been presented as examples only, and are not intended to limit the scope of the invention. These novel embodiments can be practiced in various other forms, and various omissions, replacements, and modifications can be made without departing from the spirit of the invention. Such embodiments and modifications are included in the scope and spirit of the invention as well as in the invention described in the claims and their equivalents.

What is claimed is:

1. A semiconductor memory device comprising:
   a first word line;
   a first, a second, and a third bit line;
   a first select transistor including a gate electrode connected to the first word line, and one end of the first select transistor connected to the first bit line via a first variable resistance element and other end of the first select transistor connected to the second bit line;
   a second select transistor including a gate electrode connected to the first word line, and one end of the second select transistor connected to the third bit line via a second variable resistance element and other end of the second select transistor connected to the second bit line; and
   a control circuit configured to apply a first voltage to the first word line, to apply a second voltage to the first bit line, to apply a third voltage different from the second voltage to the second bit line, and to apply a fourth voltage different from the second voltage to the third bit line in a writing data.

2. The semiconductor memory device according to claim 1, wherein the second voltage is higher than the third voltage and the fourth voltage.

3. The semiconductor memory device according to claim 1, wherein the second voltage is lower than the third voltage and the fourth voltage.

4. The semiconductor memory device according to claim 1, wherein the third voltage is equal to the fourth voltage.

5. The semiconductor memory device according to claim 1, wherein the control circuit is configured to apply the first voltage to the first bit line after applying the third voltage to the second bit line.

6. The semiconductor memory device according to claim 5, wherein the control circuit is configured to apply the fourth voltage to the third bit line after applying the third voltage to the second bit line.

7. The semiconductor memory device according to claim 1, further comprising:
   a fourth, a fifth, and a sixth bit line;
   a third select transistor including a gate electrode connected to the first word line, and one end of the third select transistor connected to the fourth bit line via a third variable resistance element and other end of the third select transistor connected to the fifth bit line; and
   a fourth select transistor including a gate electrode connected to the first word line, and one end of the fourth select transistor connected to the sixth bit line via a fourth variable resistance element and other end of the fourth select transistor connected to the fifth bit line;
   wherein the control circuit is configured to apply a fifth voltage to the fourth bit line and to apply a sixth voltage different from the second voltage to the fifth bit line.

8. The semiconductor memory device according to claim 7, wherein the fifth voltage is different from the sixth voltage.

9. The semiconductor memory device according to claim 8, wherein the second voltage is different from the fifth voltage.

10. The semiconductor memory device according to claim 7, wherein the second voltage is equal to the fifth voltage.

11. The semiconductor memory device according to claim 7, wherein the control circuit is configured to apply a seventh voltage equal to the sixth voltage to the sixth bit line.

12. The semiconductor memory device according to claim 7, wherein the control circuit is configured to set the sixth bit line in floating state.

13. The semiconductor memory device according to claim 7, wherein the fifth voltage is equal to the sixth voltage.

* * * * *